United States Patent [19]

Ishihara et al.

[11] Patent Number: 4,624,045
[45] Date of Patent: Nov. 25, 1986

[54] METHOD OF MAKING THIN FILM DEVICE

[75] Inventors: Shinichiro Ishihara, Hirakata; Takashi Hirao, Moriguchi; Koshiro Mori, Osaka; Masaharu Ono, Higashiosaka; Masatoshi Kitagawa, Hirakata, all of Japan

[73] Assignee: Matsushita Electric Industrial Co., Ltd., Kadoma, Japan

[21] Appl. No.: 716,604

[22] Filed: Mar. 27, 1985

Related U.S. Application Data

[63] Continuation of Ser. No. 418,002, Sep. 14, 1982, abandoned.

[30] Foreign Application Priority Data

Sep. 26, 1981 [JP] Japan ............................ 56-152751

[51] Int. Cl.$^4$ ................ H01L 31/18; H01L 27/14
[52] U.S. Cl. ................................ 29/572; 136/244; 136/249; 136/258; 148/187; 357/30
[58] Field of Search .......... 29/572; 136/244, 249 MS, 136/258 AM; 357/30; 148/187

[56] References Cited

U.S. PATENT DOCUMENTS

| | | | |
|---|---|---|---|
| 4,042,418 | 8/1977 | Biter | 136/249 MS |
| 4,334,120 | 6/1982 | Yamano et al. | 136/248 |
| 4,428,110 | 1/1984 | Kim | 29/572 |
| 4,443,651 | 4/1984 | Swartz | 136/249 |

Primary Examiner—Aaron Weisstuch
Attorney, Agent, or Firm—Cushman, Darby & Cushman

[57] ABSTRACT

A thin film device such as an amorphous thin film solar battery is easily made with high integration by use of metal-diffused regions in the thin film as an electrical connection region across the thickness of the thin film. By use of such metal-diffused regions 24, 24 . . . for connection between transparent stripe shaped electrodes 21', 21'. . . disposed between glass substrate 20 and amorphous silicon thin film 23 and stripe shaped metal electrodes 25, 25 . . . on the top surface of the thin film 23, series connected solar battery cells can be made with a small number of process steps.

2 Claims, 14 Drawing Figures

METHOD OF MAKING THIN FILM DEVICE

This is a continuation of application Ser. No. 418,002, filed Sept. 14, 1982, which was abandoned upon the filing hereof.

BACKGROUND OF THE INVENTION

1. Field of the Invention

The present invention relates to a method of making a thin film device comprising a thin film, such as an amorphous silicon thin film, on a substrate. The present invention is suitable for a device wherein active or inactive devices on the substrate are disposed in one or other states for integration and extension. More particularly, the present invention is suitable in an amorphous type silicon solar battery wherein many element batteries are series connected.

2. Description of the Prior Art

As is hitherto known, integrated circuits are made by integration of diodes, transistors, etc. on a single crystalline silicon substrate, but their problem has been their high prices since thay are of 2-dimensional construction on expensive silicon single crystalline substrates in which very shallow surface parts only have been utilized. In recent years, in order to improve integration of the semiconductor devices, various proposals have been made. Among such proposals, a three-dimensional circuit construction has been proposed. One example of such proposed construction is to bore openings through an epitaxially grown single crystalline layer and vapor deposit thereon so as to make a contact with the underlying electrode or layer. But the method is not easy, and has not been brought into actual use because of its having many troublesome steps.

On the other hand, a thin film solar battery which has an opto-electronic conversion thin film on a substrate is exemplified by the amorphous silicon solar battery, wherein many unit cells are series connected on the substrate as shown by FIG. 1(a), which is a schematic perspective view of a conventional series connected solar battery. In FIG. 1(a), several first electrodes 2 of a transparent conductive film with a predetermined pattern are formed on a transparent substrate 1. A thin film 3 consisting of amorphous silicon layers of known P-I-N structure of strip shape is formed on each of the first electrodes 2. A second electrode 4 is formed on each of the thin films and on the laterally extended part of the first electrode 2 of the next cell. In this conventional device, the front end parts 5 of FIG. 1(a) constitute series connections, where each first electrode, a second electrode disposed thereover and a thin film inbetween forms one solar battery cell; and each first electrode 2 is connected to the second electrode 4 of the next cell at the front end portions, thereby making series connections of the solar battery cells. With the construction as shown in FIG. 1(a), when the size of the device becomes large and therefore the length l of each of their film devices becomes large, then the average length of the current path becomes long, thereby increasing the series resistance of the overall device.

Another exemplary conventional device is shown in FIG. 1(b), wherein strip shaped and parallel disposed transparent first electrodes 7 are formed on a transparent substrate 6, thin films 8 of amorphous silicon of P-I-N layer structure of strip shaped pattern are disposed on the transparent first electrode 7, and further thereon strip shaped second electrodes 9 are formed. The first electrode 7 and the second electrodes 9 are formed and connected as follows: Each first electrode 7 extends slightly leftward for all of its length beyond the coverage by the corresponding thin film 8 thereon. Each thin film 8 is formed slightly rightward beyond the right end of the first electrode 7 thereby to touch the substrate 6. Each second electrode 9 extends slightly rightward for all of its length beyond the area over the corresponding thin film 8 thereunder. Thereby each second electrode 9 is connected with its right end portion to the left end portion part of the first electrode 7 of the next rightward cell, thereby making series connection of all the cells on the substrate, each along its whole length. Therefore, in this conventional device of FIG. 1(b), even though the length of the individual devices becomes large, this does not increase the current path. However, in this example, since the amorphous silicon is deposited by glow discharge in a relatively low vacuum of about 1 Torr, the discharge is disturbed by the pattern mask for forming the thin film amorphous silicon film in discrete strip shapes. Therefore, the precision of the thin film pattern is not sufficietnly high, thereby requiring a considerable area for isolating neighboring unit cells, and utility of the substrate area is limited. The problem of this prior art device is the necessity of a precise mask pattern for forming the amorphous silicon thin films, which is troublesome.

SUMMARY OF THE INVENTION

Therefore, the purpose of the present invention is to provide a novel structure and method of making a thin film device, wherein diffused regions are effectively used as conductors to connect selected parts of first electrodes which are between the substrate and a thin film with selected parts of second electrodes which are on the thin film.

A thin film device in accordance with the present invention comprises a substrate, first electrode means of a predetermined pattern formed on the substrate, a thin film of a predetermined pattern formed on selected parts of the first electrode means and exposed parts of the substrate, the thin film having at least a diffused region contacting at least a part of the first electrode means, a second electrode means of a predetermined pattern formed on selected parts of the thin film contacting the upper end of the diffused region, the diffused region thereby connecting the first electrode means and the second electrode means thereby.

The method of making a thin film device in accordance with the present invention comprises the steps of:

forming a first electrode means of a predetermined pattern on a substrate, forming a thin film on selected parts of the first electrode means and exposed parts of the substrate, forming metal for diffusion source of a predetermined pattern on either face of the thin film, diffusing the metal into the thin film to form at least a diffused region, forming a second electrode means on the thin films and exposed parts of the substrate (11, 20) and thereby making the diffused region connect at least a part of the first electrode means and at least a part of the second electrode means.

In all figures, thicknesses of various parts, especially of the thin film, are drawn enlarged for clarity of illustration.

DESCRIPTION OF THE PREFERRED EMBODIMENTS

Detailed description of the present invention is given hereinafter in reference to FIG. 2(a) and thereafter.

Figure 2A:
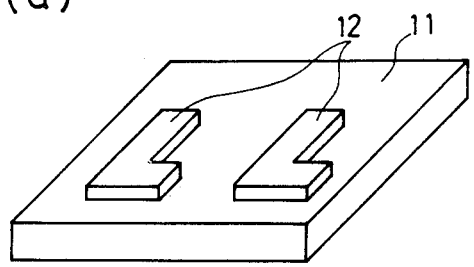
FIG. 2(a), FIG. 2(b) and FIG. 2(c) are perspective views showing the steps of making a first example embodying the present invention.
Figure 2B:
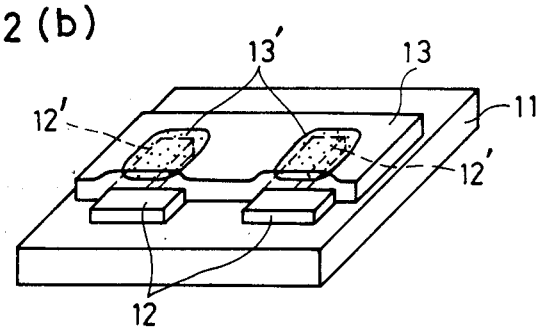
Figure 2C:
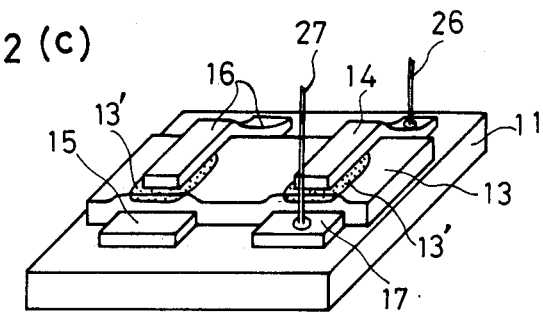

FIG. 2(a), FIG. 2(b) and FIG. 2(c) show the principle of the present invention, wherein the lower electrodes 12, 12 and the upper electrodes 14, 16 are disposed on both faces of the thin film 13 and connected through the thin film 13 by diffused regions 13' of high conductivity. For instance, the diffused region 13' is formed by diffusion of metal such as Al. As the thin film, a film or layer of single crystalline, polycrystalline or amorphous semiconductor or combinations thereof may be used. The semiconductor may be Si or GaAs or mixed compounds thereof. As the metal to be diffused into the thin film, Al, Zn, Sb, etc. may be used.

An exemplary device is elucidated in reference to FIG. 2(a) to FIG. 2(c).

First, a cleaned glass sheet 11 is prepared as a substrate, and thereon, Al electrodes 12, 12 are formed by vapor deposition as shown in FIG. 2(a). Then by decomposition of $SiH_4$ in a glow discharge, amorphous silicon film 13 is continuously formed over the electrodes 13 and the exposed face of the substrate 11, in a manner so as not to cover bonding portions 12', 12' of the electrodes 12-12. The deposition of the amorphous silicon film is carried out by a glow discharge process while keeping the substrate at a temperature of between 180° C. and 300° C. in a vacuum of 0.2–2 Torr. For instance, a 5000 Å thick film is formed in 30 minutes duration. During this process, aluminum of the Al electrodes 12, 12 at the portion covered by the amorphous silicon film 13 diffuses into the amorphous silicon film 13, and the diffusion front penetrates the film to the upper face, thereby forming Al diffused regions S131', 13' . . . . The thickness of the aluminum film deposited as the diffusion source should preferably be at least comparable to that of the thickness of the amorphous thin film to be deposited thereon. Thereafter, second electrodes 14, 16 are vapor deposited so as to face the first electrodes 12, 12 with the thin film 13 in between. The measured resistances between the lower electrode terminal 15 and the upper electrode terminal 16 thereover, and between the lower electrode terminal 17 and the upper electrode terminal 14 thereover are less than 10 $\Omega$cm, and these values are far less than known values of about $10^9$ $\Omega$cm of conventional amorphous silicon. Provided that the thickness of the thin film is about 5000 Å, then its actual resistance becomes $10^{-3}\Omega$ or lower, which is sufficiently small for the electric connection in the direction of thickness.

As the metal of the diffusion metal source under the thin film 13, Au, In, Pd, or Pt may be used instead of Al.

When Al is used as the diffusion metal source, selective portions of the surface of Al may be oxidized so as to prevent diffusion therefrom in order to limit the area or obtain a desired pattern of the diffused region 13'.

By using the process of the present invention, vertical connection by the diffused region(s) 13' can be made through any type of thin film, for example, semiconductor thin films consisting of P-I-N layers; thereby a complicated circuit structure can be accomplished.

Figure 3A:
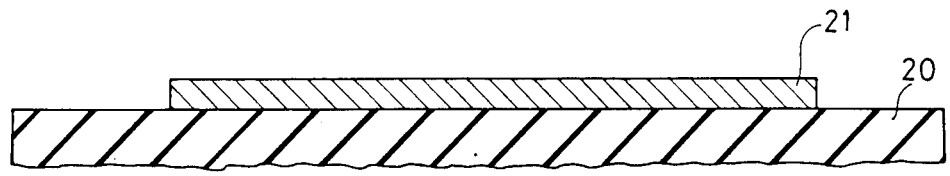
FIG. 3(a), FIG. 3(b), FIG. 3(c) and FIG. 3(d) are sectional views
Figure 3B:
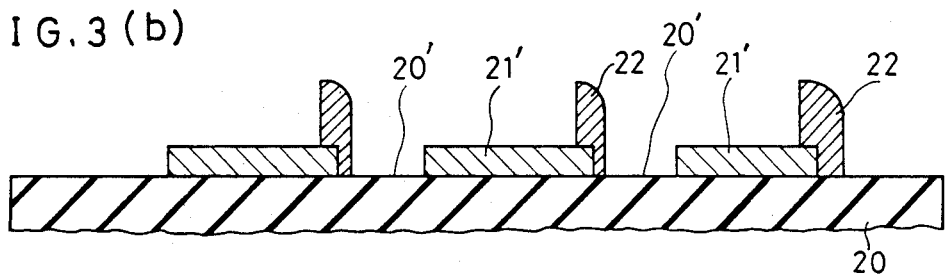
Figure 3C:
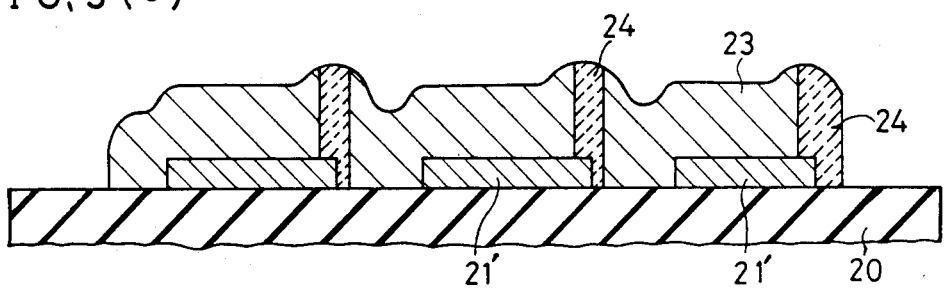
Figure 3D:
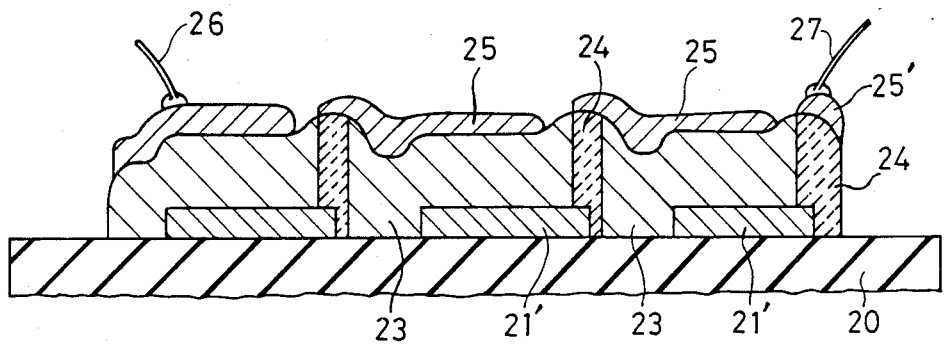
Figure 3E:
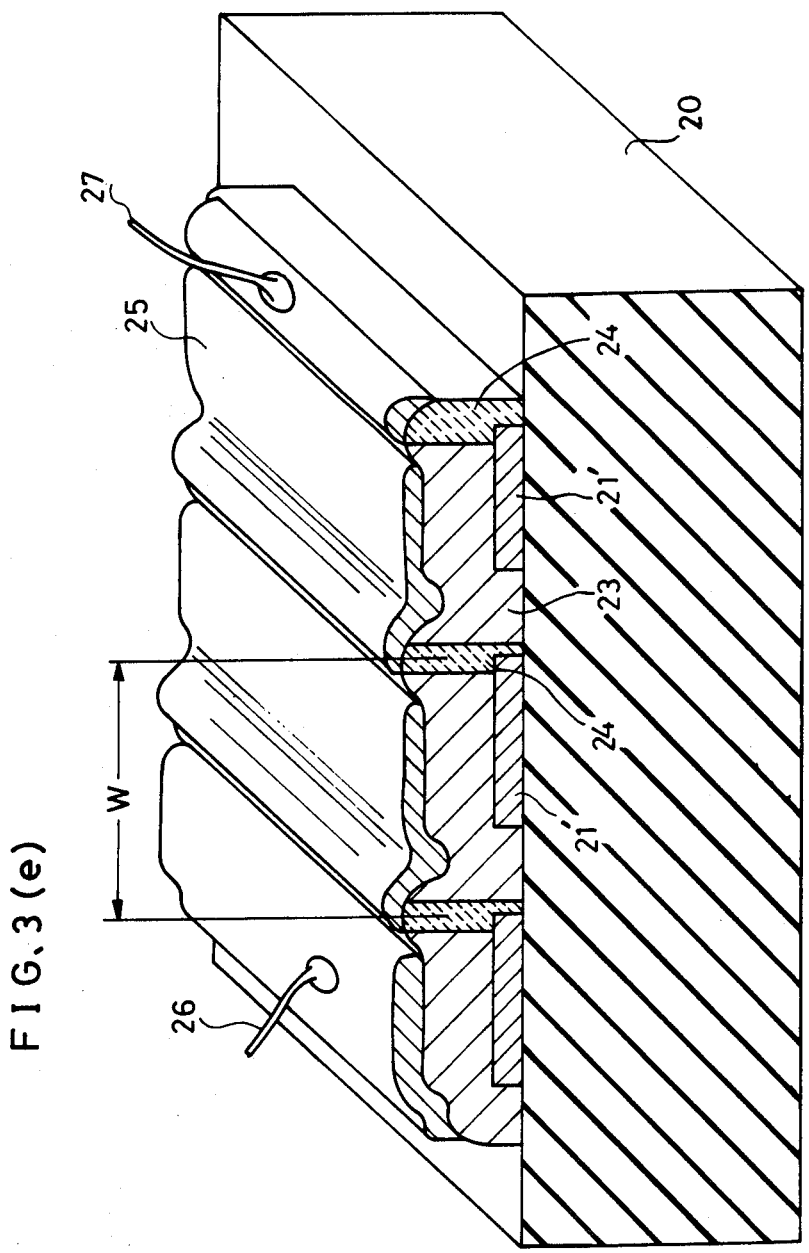
FIG. 3(e) is a schematic perspective view respectively, of a second example embodying the present invention.

A concrete embodiment of a thin film solar battery embodying the present invention is elucidated referring to FIG. 3(a) to FIG. 3(d), which are sectional views showing the steps of making a thin film solar battery of the present invention, and FIG. 3(e), which is a perspective view of the completed thin film solar battery.

First, a cleaned glass sheet 20 is prepared as a substrate, and thereon a transparent electrode 21, for instance an $SnO_2$ film, is formed on almost all of the surface of the cleaned glass substrate 20 by a known vapor deposition method, as shown in FIG. 3(a).

Then the transparent electrode 21 is etched by known method to form stripe shaped electrodes 21', 21' . . . disposed parallelly with predetermined spaces 20', 20'. . . . inbetween.

Thereafter, as shown in FIG. 3(b), Al stripes 22, 22 . . . as diffusion metal sources are disposed each contacting one end of each electrode 21' by means of a known vapor deposition method. The figures are drawn enlarged in the vertical direction in order to clearly show the configuration. The forming of the Al 22 in the stripe shape may be made by any known suitable method, such as vapor deposition using a stripe pattern mask (not shown) or vapor deposition on substantially all the face of the above-processed substrate, followed by photolithographic etching to make the stripe shaped pattern of Al. Thereafter, a semiconductor thin film, for instance, an amorphous silicon thin film 23 of P-I-N structure is formed continuously on substantially the entire face of the substrate, as shown in FIG. 3(c). The amorphous silicon thin film 23 is formed by a known method, such as decomposition of $SiH_4$ by glow discharge.

The deposition of the amorphous silicon is carried out by a glow discharge process while keeping the substrate at a temperature of between 180° C. and 300° C. in a vacuum of 0.2–2 Torr. For instance, 5000 Å thick film is formed in 30 minutes duration. During this process of depositing the amorphous silicon film, aluminum of the diffusion source 22 covered by the amorphous silicon film 23 diffuses into the amorphous silicon film 23, and the diffusion front penetrates the film to the upper face, thereby forming Al diffused regions 24, 24 ... as shown in FIG. 3(c). Each Al diffused region 24 is formed to contact the right end of each first electrode 21'. The thickness of the aluminum film deposited as the diffusion source should preferably be at least comparable to that of the thickness of the amorphous thin film to be deposited thereon.

Thereafter, second electrodes 25, 25 of a suitable metal such as aluminum are vapor deposited in stripe shape so as to almost face the first electrodes 21', 21' . . . with the thin film 23 inbetween as shown in FIG. 3(d). Each second electrode 25 is formed to contact at its left end the top surface of the diffused region 24. Each pair constituted by a lower electrode 21' and an upper electrode 25 thereover with the amorphous silicon film 23 inbetween form one cell of the solar battery. The solar battery cells are series connected by the connection of the right ends of the lower electrodes 21' via the diffused region 24 to the left ends of the upper electrode 25 of the next solar battery cells. When the thickness of the thin film is about 5000 Å, the resistance between the lower electrode 21' and the upper electrode for each cell is about $10^{-3}\Omega$ or lower, which is sufficiently small for the electric connection in the direction of thickness.

As the metal of the lower and upper electrodes, Au, In, Pd, or Pt may be used instead of Al.

Finally, lead out wires 26 and 27 of gold or the like are connected to the upper electrodes of both ends, as shown in FIG. 3(d), and a solar battery as shown in FIG. 3(e) is finished.

Figure 4A:
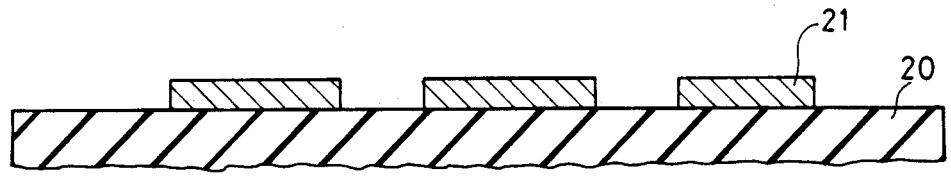
FIG. 4(a), FIG. 4(b), FIG. 4(c) and FIG. 4(d) are sectional views of a third example.
Figure 4B:
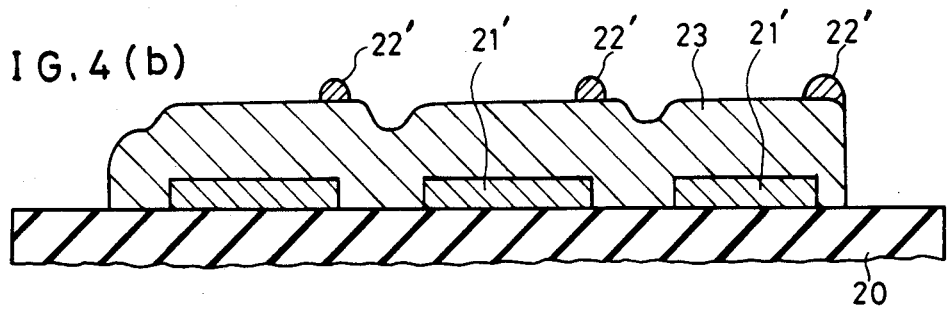
Figure 4C:
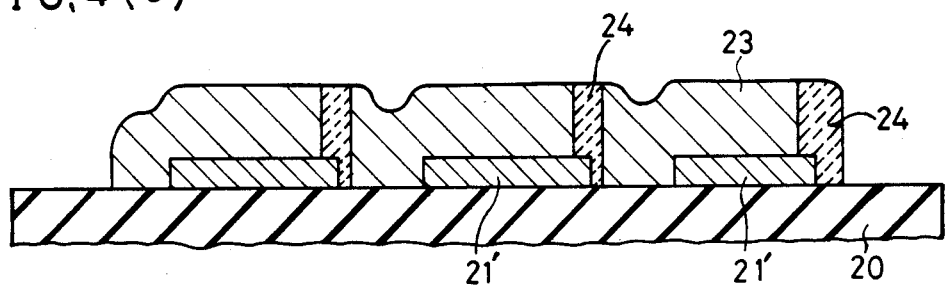
Figure 4D:
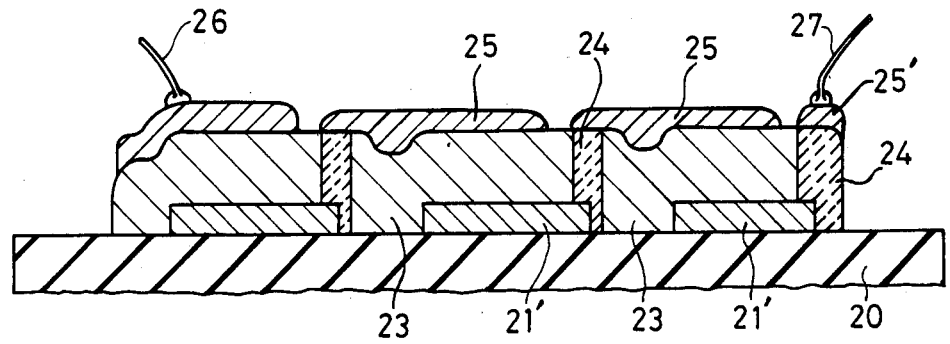

Instead of forming the pattern of diffusion source metal prior to forming the thin film 23 of semiconductor, an other way may be employed, such as that shown in FIG. 4(a) and (b), wherein the diffusion source metal stripes 22', 22' ... are vapor deposited on the semiconductor thin film 23, and thereafter the diffusion source metal stripes 22', 22' ... are irradiated by a laser beam or similar type energy beam thereby to heat them and make them diffuse into the thin film 23 to form the diffused conductive layer 24 as shown in FIG. 4(c). The final steps, that is forming of the second or upper electrodes 25, 25 ... and the lead out wires 26 and 27, are substantially the same as that of preceding example shown in FIG. 3(a) to FIG. 3(d).

Still another method is that wherein the aluminum stripes 22, 22 ... are vapor deposited on predetermined positions on the semiconductor thin film, such as amorphous silicon thin film 23, during the period when the substrate temperature is kept raised so as to diffuse the aluminum simultaneously with depositing thereof.

Still another method is that wherein the aluminum stripes 22, 22 ... are vapor deposited on predetermined positions on the semiconductor thin film, such as amorphous silicon thin film 23, after the substrate temperature is lowered substantially to room temperature, and thereafter the substrate temperature is raised thereby to diffuse the aluminum. After the substrate temperature is lowered the second or upper electrodes 25, 25 ... are formed thereon.

Figure 1A:
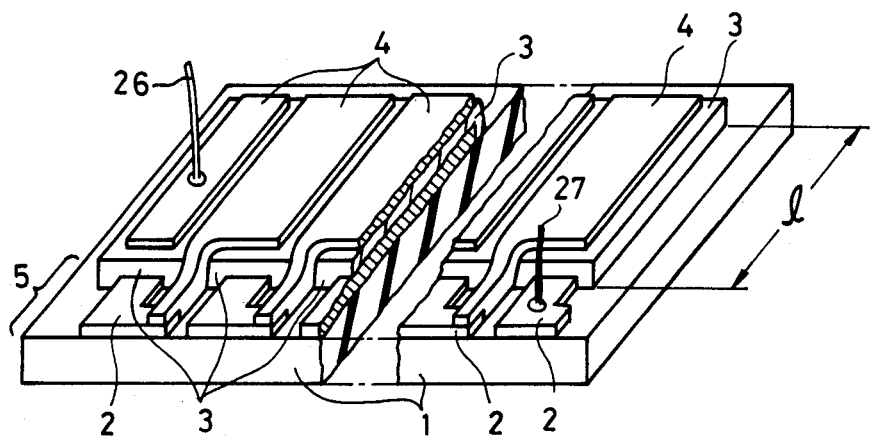
FIG. 1(a) and FIG. 1(b) are perspective views of exemplary conventional solar batteries.
Figure 1B:
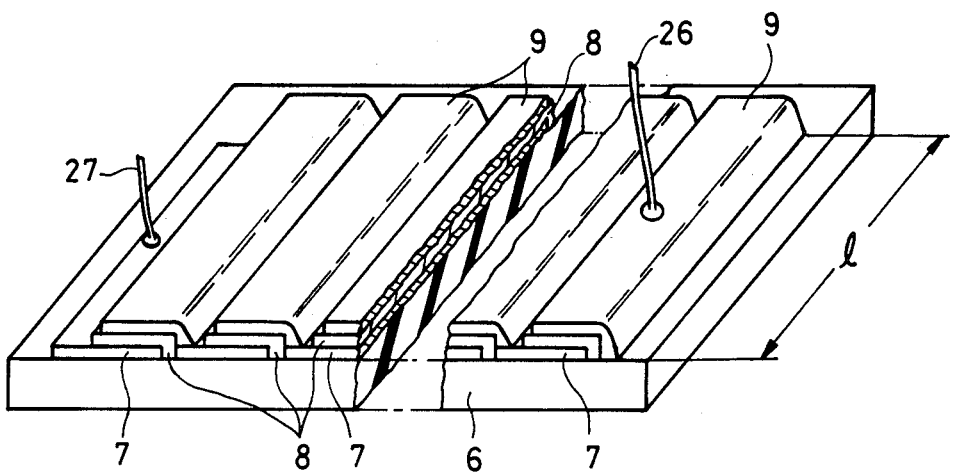

By use of the present invention, series connection along the lengths of its unit cells on a solar battery device is very easily attained without use of complicated masks or a plurality of photolithographic processes and therefore, conductivity of the series connection is satisfactory. Further, by dispensing with the photoresist mask, time-dependent deterioration due to possible pin-holes in such masks is avoided, and accordingly the production yield is much improved. Besides, since the reliability and connection conductivity of the diffused regions to the electrodes are satisfactory, a moderate width of the diffused region suffices for the connection, and therefore, the width W of unit cell or element of the device can be made smaller than the conventional device such as of FIG. 1(a) or FIG. 1(b). Therefore higher integration can be attainable according to the present invention.

What is claimed is:

1. A method for forming an array of series-connected thin film devices comprising the steps of:

forming a plurality of spaced apart conductive first electrodes on an insulative substrate, forming a corresponding plurality of diffusion metal sources each of which is in contact with a respective one of said first electrodes, selective portions of the surface of said diffusion metal sources being oxidized to selectively prevent diffusion therefrom, forming a thin film of semiconductive material on said conductive first electrodes and insulative substrate, diffusing metal from each of said diffusion metal sources into said thin film thereby to produce diffused regions in said thin film at the same time as said forming of said thin film in a manner such that said diffused regions reach the remote surface of said thin film during said forming of said thin film, and forming a plurality of spaced apart conductive second electrodes on the surface of said thin film and said diffused regions, thereby forming electrical connections between said first electrodes and said second electrodes.

2. A method for forming an array of series-connected thin film devices comprising the steps of:

forming a plurality of spaced apart conductive first electrodes on an insulative substrate, forming a corresponding plurality of diffusion metal sources each of which is in contact with a respective one of said first electrodes, each of said diffusion metal sources being an evaporated aluminum film whose surface is selectively oxidized to selectively prevent diffusion therefrom, forming a thin film of amorphous silicon on said conductive first electrodes and insulative substrate, diffusing aluminum from each of said aluminum diffusion sources into said thin film thereby to produce diffused regions in said thin film at the same time as said forming of said thin film in a manner such that said diffused regions reach the remote surface of said thin film during said forming of said thin film while keeping said insulative substrate at a temperature of between 180° and 300° C., and forming a plurality of spaced apart conductive second electrodes on the surface of said thin film and said diffused regions, thereby forming electrical connections between said first electrodes and said second electrodes.

* * * * *